United States Patent
Exel et al.

(10) Patent No.: US 7,187,545 B2
(45) Date of Patent: Mar. 6, 2007

(54) COOLING DEVICES FOR COOLING ELECTRIC COMPONENTS, MODULE INCLUDING COOLING DEVICE AND ELECTRIC COMPONENTS, AND ASSEMBLY OF COOLING DEVICE OR MODULE AND SUPPORT

(75) Inventors: Karl Exel, Ringbach (DE); Kai Kriegel, München (DE); Guy Lefranc, München (DE); Jürgen Schulz-Harder, Lauf (DE)

(73) Assignees: Siemens Aktiengesellschaft, Munich (DE); Curamik Electronics GmbH, Eschenbach (DE)

( * ) Notice: Subject to any disclaimer, the term of this patent is extended or adjusted under 35 U.S.C. 154(b) by 102 days.

(21) Appl. No.: 10/515,279

(22) PCT Filed: May 9, 2003

(86) PCT No.: PCT/DE03/01498

§ 371 (c)(1),
(2), (4) Date: May 20, 2005

(87) PCT Pub. No.: WO03/098686

PCT Pub. Date: Nov. 27, 2003

(65) Prior Publication Data

US 2005/0213304 A1    Sep. 29, 2005

(30) Foreign Application Priority Data

May 22, 2002  (DE)  ................................ 102 22 681

(51) Int. Cl.
*G06F 1/16*   (2006.01)
*H05K 7/20*   (2006.01)

(52) U.S. Cl. ..................... 361/687; 361/713; 165/80.5; 210/90

(58) Field of Classification Search ........ 361/689–702, 361/711, 707, 715, 717–718, 679–687, 729–727; 165/80.4, 80.5; 210/90; 264/167, 558; 414/431
See application file for complete search history.

(56) References Cited

U.S. PATENT DOCUMENTS 5,978,220 A    11/1999    Frey et al.

(Continued)

FOREIGN PATENT DOCUMENTS

DE    3404027    8/1984

(Continued)

OTHER PUBLICATIONS

Schulz-Harder et al., "Directionally bent Alumina DBC Substrates", Proceedings of the 12th European Microelectronics & Packaging Conference, 1999, pp. 489-493.

(Continued)

*Primary Examiner*—Hung Van Duong
(74) *Attorney, Agent, or Firm*—Staas & Halsey LLP

(57) ABSTRACT

At least one power semiconductor component is cooled by a flat, copper, plate-type hollow body conducting a coolant fluid. Components are fixed on one flat-sided surface of the hollow body and the other flat-sided surface includes two coolant fluid openings for introducing the coolant fluid into the hollow body and for evacuating the fluid therefrom. The other flat-sided surface is concave and elastically deformable between the coolant fluid openings. The concave other surface is attached to the even surface of a support in such a way that the concave surface and the even surface are pressed against each other by the elastically planar deformation of the concave surface and that the coolant fluid openings are sealed in a fluidproof manner by O-rings. A solid strut, which interconnects the two flat-sided surfaces is additionally configured in the hollow body. The cooling device may be used in a module or an assembly including a support and the cooling device or module. The device is useful in electric transmissions, in particular, in motor vehicles.

24 Claims, 3 Drawing Sheets

U.S. PATENT DOCUMENTS

| | | | |
|---|---|---|---|
| 6,014,312 A | 1/2000 | Schulz-Harder et al. | |
| 6,839,234 B2* | 1/2005 | Niwatsukino et al. | 361/695 |
| 6,929,739 B2* | 8/2005 | Pohl et al. | 210/90 |
| 2005/0117298 A1* | 6/2005 | Koga et al. | 361/699 |

FOREIGN PATENT DOCUMENTS

| | | |
|---|---|---|
| DE | 39 40 933 | 6/1991 |
| DE | 19643717 A1 | 4/1998 |
| DE | 197 10 783 | 9/1998 |
| DE | 199 25 510 | 12/2000 |
| EP | 0 014 249 | 8/1980 |
| EP | 0 254 692 | 1/1988 |
| EP | 0 978 874 | 2/2000 |

OTHER PUBLICATIONS

Exel et al., "Water cooled DBC Direct Bonded Copper Substrates", Proceedings of the 24th Annual Conference of the IEEE, 1998, pp. 2350-2354.

Schulz-Harder, J., "DBC Substrates as a Base for Power MCM's", Proceedings of the 2000 Electronics Packaging Conference, 2000, pp. 315-320.

* cited by examiner

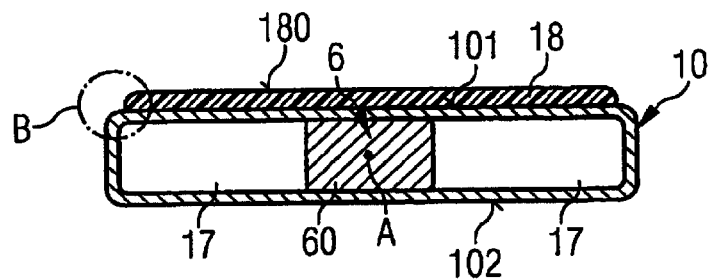
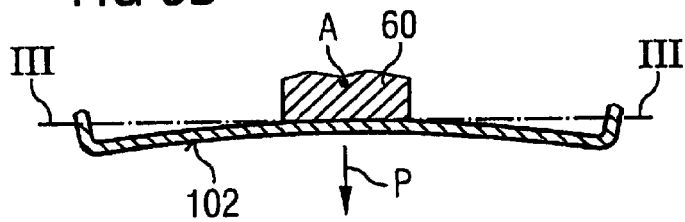
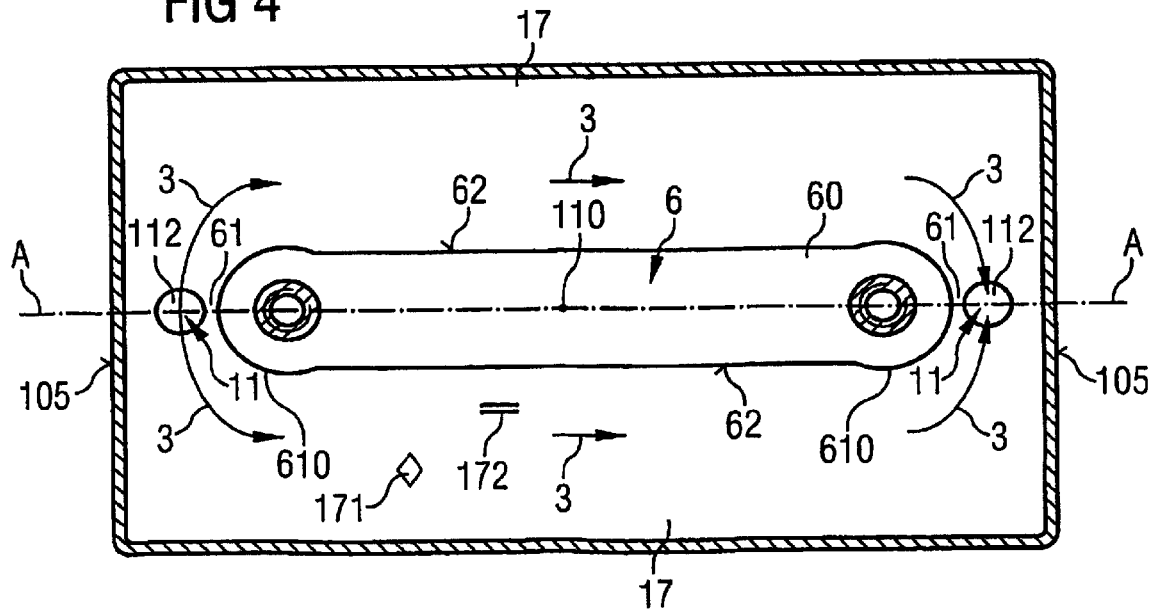

1

COOLING DEVICES FOR COOLING ELECTRIC COMPONENTS, MODULE INCLUDING COOLING DEVICE AND ELECTRIC COMPONENTS, AND ASSEMBLY OF COOLING DEVICE OR MODULE AND SUPPORT

CROSS REFERENCE TO RELATED APPLICATIONS

This application is based on and hereby claims priority to PCT Application No. PCT/DE03/01498 filed on 9 May 2003, the contents of which are hereby incorporated by reference.

BACKGROUND OF THE INVENTION

1. Field of the Invention

The invention relates to a cooling device for cooling one or more electrical components, a module including such a cooling device and electrical components fixed to it, an arrangement including such a cooling device and of a support and an arrangement including such a module and such a support.

2. Description of the Related Art

A cooling device of the type named is known from U.S. Pat. No. 6,014,312. This known cooling device has a hollow body for conducting the coolant fluid between two flat-sided surfaces of the hollow body, facing away from each other, that include several layers of metal stacked one on the other, that are joined flat to each other and each of which has a number of small openings that overlap from layer to layer and form passages for the coolant fluid through the layered stack.

In each layer there are also two large openings between which the small openings of this layer are arranged. The large openings are arranged one above the other in the layered stack and thus form two coolant fluid collecting cavities in the hollow body between the even flat-sided surfaces of the hollow body that are faced away from each other and defined by closed outer layers of the layered stack.

Each of the electrical components to be cooled is to be fixed, insulated from the coolant fluid in the hollow body by a layer of ceramic material that has good heat conducting and electrically insulating properties, to one of the two flat-sided surfaces of the hollow body. The ceramic layer can be placed on a flat-sided surface of the hollow body or arranged between two of the layers of metal of the hollow body.

A coolant fluid opening for supplying and removing the coolant fluid in or out of this coolant fluid collecting cavity is assigned to each of the two coolant fluid collecting cavities, that are formed in the otherwise also-closed, other even flat-sided surface of the hollow body. Each coolant fluid collecting cavity has a larger diameter than the coolant fluid opening assigned to it.

The hollow body is to be fixed to an even surfaces of a support in such a way that the even other flat-sided surface of the hollow body and the even surface of the support are facing toward each other and form a flat surface contact with each other.

The support can be a plate or a structure including a number of coolant fluid channels distributed over the complete support for supplying and removing coolant fluid.

SUMMARY OF THE INVENTION

An object of the invention is to provide an improved coolant fluid conductance with a cooling device of the type mentioned in the introduction.

An improved coolant fluid conductance with a cooling device of the type mentioned can be obtained in accordance with the invention in which the other flat-sided surface of the hollow body between the coolant fluid openings is concave and elastically deformable, and that a fixing or attachment device is provided for fixing or attaching the hollow body to the even surface of the support in such a way that the concave other flat-sided surface of the hollow body and the even surface of the support are pressed together with an elastic planar deformation of the concave other flat-sided surface of the hollow body.

The cooling device has the advantage that it can be fixed to an even surface of a support in a simple manner, that does not require a structure including a number of coolant fluid channels distributed over the complete support, but instead advantageously has only a single coolant fluid channel for each coolant fluid opening of the cooling device for the supply or removal of the coolant fluid to and from this coolant fluid opening, with additionally having the particular advantage that this coolant fluid opening and this coolant fluid channel can be simply and easily sealed against coolant fluid leakage to the environment during the operation of fixing the cooling device to the support, by a common O-ring alone.

Because the coolant, fluid therefore can advantageously be supplied through a single coolant fluid channel in the support to the assigned coolant fluid opening of the cooling device, or removed from same, and such a channel can be simply produced. For example, a coolant fluid channel of this kind can be formed by drilling a through-hole in the support.

To fix the cooling device all that is required is that the support has an even surface in which, for each coolant fluid opening in the concave other flat-sided surface of the hollow body of the cooling device, there is a termination of a coolant fluid channel, formed in the support for the supply or removal of coolant fluid, that is assigned in each case to one of these coolant fluid openings, that the even surface of the support and the concave other flat-sided surface of the hollow body of the cooling device are faced towards each other and arranged in such a way that the termination of the support assigned to this coolant fluid opening is opposite each coolant fluid opening of the cooling device, whereby O-rings of resilient material are arranged between these surfaces of the support and the cooling device facing towards each other, each of which encloses a coolant fluid opening of the cooling device and the termination of the fluid channel of the support opposite this coolant fluid opening, and that the cooling device and the support are fixed to each other by the fixing device of the cooling device in such a way that the concave other flat-sided surface of the hollow body of the cooling device is elastically pressed flat and each O-ring is compressed between this flat-pressed surface and the even surface of the support is compressed so that it seals the coolant fluid opening of the cooling device and the termination of the coolant fluid channel of the support opposite this coolant fluid opening, both of which are enclosed by this O-ring and provide a fluid-proof seal against the environment.

With this simple fixing procedure, each coolant fluid opening of the cooling device and the termination of the coolant fluid channel opposite this coolant fluid opening are automatically provided with a fluid-proof seal against the environment and a particularly simple coolant fluid conductance is advantageously realized.

The concave flat-sided other surface of the hollow body is an essential condition for the realizability of the simple fixing of the coolant fluid device to the support, because only with it can a force sufficient to compress the O-rings arranged at the coolant fluid openings be exerted. An elastically deformable, even flat-sided other surface of the hollow body would undergo a similar convex deformation and therefore would detrimentally rather release than stress an O-ring. The fixing device of the cooling device can advantageously be realized in a simple manner by at least one threaded hole formed between the two coolant fluid openings, that has a fluid-proof seal against the coolant fluid in the hollow body, so that no coolant fluid can leak from the hollow body through this threaded hole, and that in the concave other flat-sided surface of the hollow body a threaded-hole opening is provided through which a threaded pin passing through the support is screwed into the threaded hole in order to secure the cooling device and support to each other.

By screwing the threaded pin into the threaded hole, the concave flat-sided other surface of the hollow body opposite the even surface of the support can be pulled onto the support and pressed flat against it.

In a preferable and advantageous manner, the fixing device has two threaded holes formed in the hollow body between the two coolant fluid openings, each of which has a fluid-proof seal against the coolant fluid in the hollow body so that no coolant fluid can leak from the hollow body through this threaded hole and each of which has a threaded hole opening in the concave other flat-sided surface of the hollow body through which a threaded pin passing through the support is screwed into the threaded hole, to secure the cooling device and support to each other.

In this way, a particularly strong pressure can be exerted on the O-rings and thus a particularly reliable sealing effect can be achieved by the O-rings, in particular if one threaded hole is placed close to one coolant fluid opening and the other threaded hole is placed close to the other coolant fluid opening of the cooling device.

For the threaded pins, the support requires only throughholes at the points of the threaded holes in the hollow body of the cooling device. A through-hole of this kind can, for example, again be a simple hole through which the threaded pin can be pushed or screwed.

An improved coolant fluid conductance can be obtained with a cooling device of the type mentioned in the introduction, in which a coolant fluid guide is formed in the hollow body between the coolant fluid openings, that guides the coolant fluid introduced through a coolant fluid opening in the hollow body sideways in the hollow body, past the center, between the coolant fluid openings of the hollow body to the other coolant fluid opening.

By this means, a better fluid guidance in the hollow body concentrated on the components to be cooled can advantageously be achieved and therefore a better cooling effect obtained for these components. Components not to be cooled, for example busbars, that become less hot, can advantageously be secured above the coolant fluid-free center of the hollow body to the one flat-sided surface.

The coolant fluid guide requires at least one deflecting surface arranged close to the coolant fluid opening, that deflects the coolant fluid passing through this coolant fluid opening and prevents a direct flow of the inlet coolant fluid from this coolant fluid opening to the other coolant fluid opening, i.e. prevents a flow through the center between the two coolant fluid openings. A deflecting surface of this kind can be realized in various ways.

With a preferred and advantageous form of the embodiment of the cooling device, the coolant fluid guide has a solid strut of material with good heat conducting properties formed in the center of the hollow body, that connects the two flat-sided surfaces of the hollow body to each other, that does not permit the passage of the coolant fluid, that is formed along the connecting line between the two coolant fluid openings and along the side of which coolant fluid introduced through a coolant fluid opening in the hollow body flows in the hollow body to the other coolant fluid opening.

With this form of embodiment, the deflecting surface of the coolant fluid guide can be simply realized by a front face of the strut, that is opposite a coolant fluid opening through which the coolant fluid is supplied. Because of the shape of this front end, the deflecting surface can be chosen as required to suit individual cases. For example, this free end can be in the form of a prism-shaped pointed end of the strut.

In a preferred and advantageous embodiment of this form of the invention, the strut has a front end that is opposite a coolant fluid opening and is rounded.

The solid strut advantageously also acts as an additional heat sink and improves the cooling effect of the cooling device.

One threaded hole of the hollow body is advantageously placed in the strut.

The coolant fluid guide can have a clearance from one edge of the coolant fluid opening or extend to the edge of a coolant fluid opening.

It is generally advantageous if a structure made of material with good heat conducting properties is formed in the hollow body, through which structure the coolant fluid can flow, that offers the flowing coolant fluid an increased contact surface and that is in a good heat-conducting contact with the flat-sided surfaces of the hollow body.

A structure of this kind improves the heat dissipation and therefore the cooling effect of the cooling device and can be realized in a variety of ways, for example by a lattice and/or an interlinked fabric and/or a sponge.

Advantageously, the structure of good heat-conducting material has small cavities, each of which is enclosed by this material and in connection with each other, and/or small channels, each of which is enclosed by this material and connects the two coolant fluid openings to each other.

Such structures for example include a grid or a sponge derived from the structures in the named U.S. Pat. No. 6,014,312 etc.

In particular, the hollow body can have a cooling device in accordance with the invention such as a cooler according to the U.S. Pat. No. 6,014,312 with a layered stack including layers of good heat-conducting material provided with small holes, whereby the holes are offset from layer to layer, but do overlap. With this type of structure, a solid strut in the hollow body can be realized simply by areas of the layers that are without holes that lie one above the other in the stack. The structure of good heat-conducting material with the cooling device in accordance with the invention advantageously extends up to one edge of a coolant fluid opening, in contrast to a cooler according to U.S. Pat. No. 6,014,312. The structure in this case can enclose the edge of the coolant fluid opening, or can extend only along a part section of this edge but not over the complete edge, particularly if a coolant fluid guide extends up to the edge of this coolant fluid opening.

A particularly preferred form of embodiment of a cooling device in accordance with the invention can be formed whereby
- the hollow body can be made of electrically conducting material and
- the electrical component(s) fixed to the cooling device is/are electrically insulated from the coolant fluid in the hollow body by a layer of good heat-conducting and electrically-insulating material, that is parallel to a flat-sided surface of the hollow body and is fixed to the hollow body.

The layer of good heat-conducting, electrically-insulating material is preferably placed on the one flat-sided surface of the hollow body of the cooling device and can, where the hollow body has a stack of layers of electrically-conducing material, also be arranged between two such layers.

A layer of electrically-conducting material arranged on the side of the layer of heat-conducting and electrically-insulating material facing away from the hollow body, whether it is a layer of the stack or a layer of electrically-conducting material fitted afterwards, is preferably structured, for example to form electrical conductors, that in the case of electrical components to be cooled that are in the form of power semiconductor components can be busbars.

The layer of electrically-conducting material can extend over the complete surface of the complete hollow body. Because of the problems that can result from different thermal coefficients of expansion between the electrically-conducting material of the hollow body and the material of the electrically-insulating layer, and for example cause delamination of the electrically-conducting layer from the hollow body, it can be advantageous if the layer of good heat-conducting material and electrically-insulating material is arranged in sections separate from each other.

The layer of good heat-conducting and electrically-insulating material is preferably of a ceramic material and the electrically-conducting material of the hollow body is preferably made of copper.

It is of particular advantage if the layer of good heat-conducting and electrically-insulating material attached to the hollow body has a lower coefficient of thermal expansion than the hollow body.

This measure advantageously results in a particularly simple method of manufacturing the cooling device in accordance with the invention with the hollow body that has the elastically deformable concave other flat-sided surface.

This method consists simply in that the layer of good heat-conducting and electrically-insulating material is firmly fixed to the hollow body at higher temperature and the layer and hollow body are subsequently cooled down. During the cooling, the material of the hollow body contracts more than the material of the electrically-insulating layer and because of this "bimetal effect" itself creates the elastically deformable concave other flat-sided surface of the hollow body.

For example, an electrically-insulating layer coated with metal is soldered to a flat-sided metal surface of the hollow body. During the soldering operation, the layer and the hollow body heat up and expand at different rates, i.e. the hollow body at a greater rate than the layer. As the solder solidifies, the hollow body and the layer join together while the temperature is still high. During the subsequent cooling, the hollow body contracts more than the layer connected to it, so that after cooling the other flat-sided surface of the hollow body itself becomes concave and can be elastically deformed.

Up to now this "bimorph or bimetal effect" was a disturbing effect and attempts were made to avoid it, for example to achieve flat-sided surfaces of the hollow body, e.g. by using an electrically insulating layer of the same material in each case on each flat-sided surface of the hollow body. The invention has departed from this and deliberately utilizes the "bimorph or bimetal effect". The "bimorph or bimetal effect" can advantageously be used regardless of whether the hollow body has a coolant fluid guide, particularly a solid strut, or not.

A cooling devices in accordance with the invention can be used in a novel type of module with a cooling device of this kind and one or more electrical components that are attached to the one flat-sided surface of the hollow body of the cooling device is created.

This module can advantageously be equally simply secured to the support with the aid of O-rings, as described above with regard to the cooling device alone without electrical components.

In concrete terms, this means that for a module of this kind
- a support is used that has an even surface in which for each coolant fluid opening in the concave other flat-sided surface of the hollow body of the cooling device of the module a termination of a coolant fluid channel formed in the support for the supply or removal of coolant fluid is assigned to one of these coolant fluid openings in each case, that
- the even surface of the support and the concave other flat-sided surface of the hollow body of the cooling device of the module are faced towards each other and arranged in such a way that each coolant fluid opening of the cooling device of the module is opposite the termination of the fluid channel of the support assigned to this coolant fluid opening, whereby
- between these surface of the support and cooling device of the module facing toward each other, O-rings of elastic material are arranged, each of which encloses a coolant fluid opening of the cooling device of the module and the termination of the support opposite this coolant fluid opening, that
- the cooling device and the support are secured to each other by the fixing device of the cooling device in such a way that the concave other flat-sided surface of hollow body of the cooling device of the module is elastically pressed flat and each O-ring is compressed between this flat-pressed surface and the even surface of the support, so that it seals the coolant fluid opening of the cooling device of the module and the termination of the coolant fluid channel of the support opposite this coolant fluid opening, both of which are enclosed by this O-ring, to provide a fluid-proof seal against the environment.

The module can advantageously also be realized by
- a cooling device that has a coolant fluid guide, and with
- one or more electrical components that are secured to the one flat-sided surface of the hollow body of the cooling device, whereby the attached component(s) is/are arranged near the coolant fluid guide in the area of the coolant fluid flowing between the coolant fluid opening of the hollow body past the center to the other coolant fluid opening.

In a preferred and advantageous manner with this module, electrical components that generate different amounts of heat in operation are arranged in succession in the direction of flow of the cooling fluid flowing past the center between the cooling fluid openings of the hollow body to the other coolant fluid opening in such a way that a component that generates a relatively smaller amount of heat is followed by a component that generates a relatively greater amount of heat.

It is also again advantageous if electrical components that generate different amounts of heat from each other in operation are arranged in succession in the direction of flow of the coolant fluid flowing past the center between the coolant fluid openings of the hollow body to the other coolant fluid opening in such a way that a component that generates a relatively greater amount of heat is followed by a component that generates a relatively smaller amount of heat. This means particularly that components that generate a relatively greater amount of heat should be arranged on the inside and components that generate a relatively smaller amount of heat should be arranged on the outside.

Generally, an aforementioned module is preferably a power semiconductor module, i.e. at least one electrical component of this module is a power semiconductor element.

The invention has the advantage of simplicity of manufacture and an extremely flat construction.

In an embodiment of the invention, the support is part of an electrical transmission system.

With a special preferred form of an embodiment, the support is part of an electrical transmission system for a vehicle.

Water is preferred as the coolant fluid but other fluids, such as oil, can also be used.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 3a is a vertical cross-section through the module according to FIG. 1, shown lengthwise along the cut line III—III in FIG. 1.

FIG. 3b is the bottom part of the vertical cross-section according to FIG. 3a, that in contrast to FIG. 3a shows a concave other flat-sided surface of the hollow body of the module.

FIG. 4 is a horizontal section through the module in FIG. 1 taken along the cut line IV—IV in FIG. 1.

DETAILED DESCRIPTION OF THE PREFERRED EMBODIMENT

Figure 1:
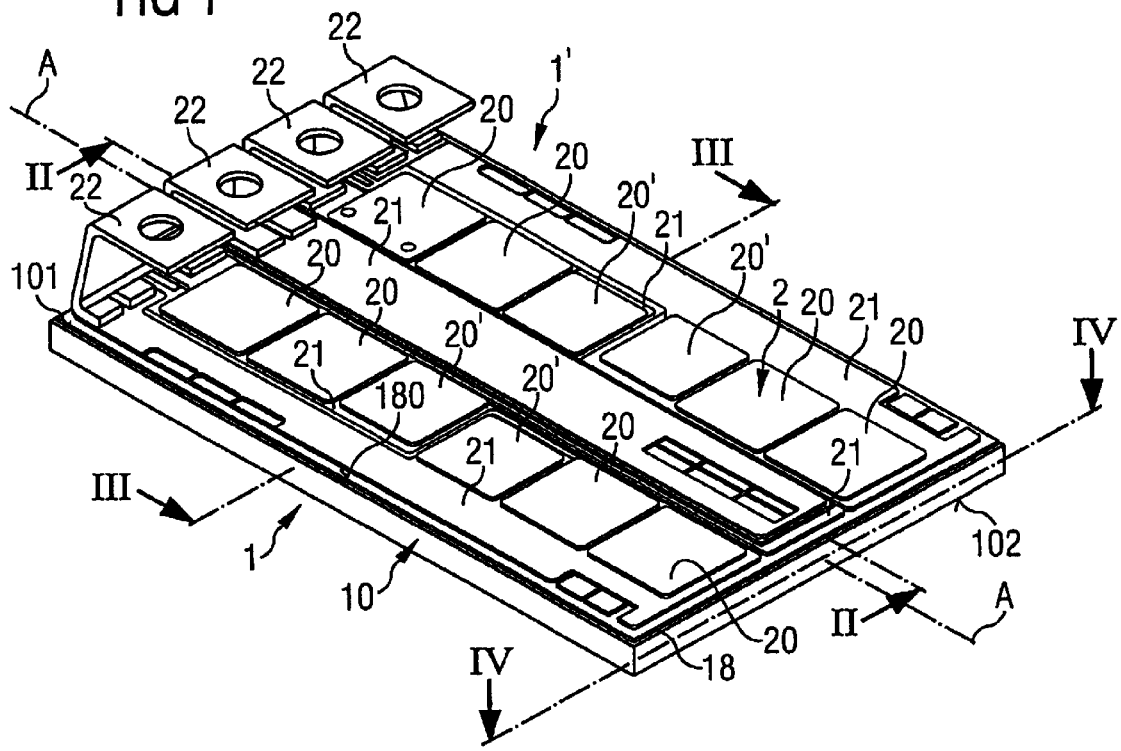
FIG. 1 is a perspective drawing of a power semiconductor module that is used in the invention.

Reference will now be made in detail to the preferred embodiments of the present invention, examples of which are illustrated in the accompanying drawings, wherein like reference numerals refer to like elements throughout.

The power semiconductor module shown in FIG. 1 and generally designed by 1' has an example of a cooling device 1 according to the invention and an arrangement 2 including several electrical components in the form of power semiconductor elements 20 and 20' to be cooled, each of which is fixed to one of two flat-sided surfaces 101 and 102, facing away from each other, of an essentially flat plate-shaped hollow body 10 of the cooling device 1, made of material, such as copper, with good heat-conducting properties.

The following is a general unrestricted assumption that the power semiconductor elements 20 and 20' are fixed to the flat-sided surface 101 of the hollow body 10, so that the surface 101 forms the one flat-sided surface and the surface 102 forms the other flat-sided surface of the hollow body 10.

The power semiconductor elements 20 and 20' could equally well be fixed to surface 102, so that surface 102 would be the one flat-sided surface and surface 101 the other flat-sided surface of the hollow body 10.

The hollow body 10 used to provide a passage for a coolant fluid 3 (shown in FIGS. 2 and 4 by thick arrows, the heads of which indicate the direction of flow of the coolant fluid) through the hollow body 10 between its two flat-sided surfaces 101 and 102. The coolant fluid 3 consists, for example, of water.

The hollow body 10 is formed as a flat plate shape and essentially is of rectangular form with a central longitudinal axis A.

The arrangement 2 of the power semiconductor elements 20 and 20' is not fixed directly to the essentially-rectangular one flat-sided surface 101 of the hollow body 10, but instead to a surface 180, facing away from the hollow body 10, of an essentially rectangular layer 18 of good heat-conducting, electrically-insulating ceramic material that is positioned on the one flat-sided surface 101 of the hollow body 10 and soldered to it. The arrangement 2 is electrically insulated from the hollow body 10 by this electrically-insulating layer 18.

In addition to the arrangement 2 including the power semiconductor elements 20 and 20' to be cooled, electrical components not to be cooled, such as busbars 21, are also for example secured to the surface 180 of the electrically-insulating layer 18.

Figure 2:
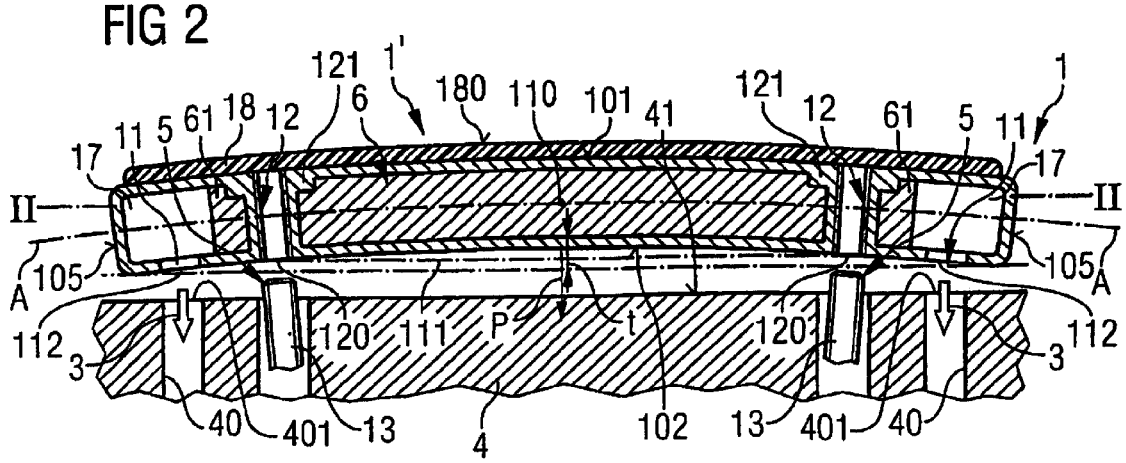
FIG. 2 is a vertical lengthwise section of the module according to FIG. 1, lengthwise along cut line II—II in FIG. 1.
Figure 5:
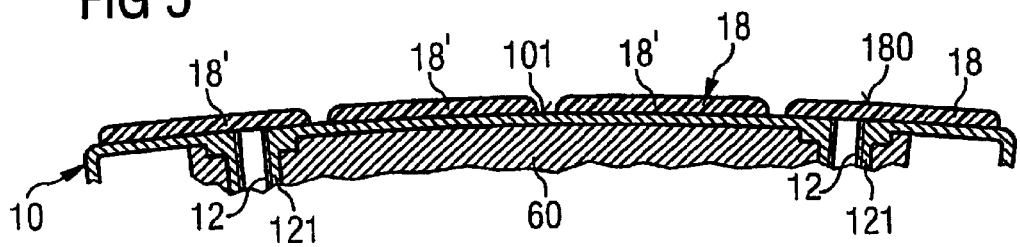
FIG. 5 is the top part of the vertical longitudinal section according to FIG. 2, that in contrast to FIG. 2 shows a subdivided layer of good heat-conducting, electrically-insulating material.

For a further explanation of the construction of the cooling device 1 or of the module 1', refer to FIGS. 2 to 4. For clarity, these figures omit the electrical components 20, 20', 21 of the module 1', where they would actually be visible.

As shown in these figures, two coolant fluid openings 11 for supply or removal of the coolant fluid 3 to and from the hollow body 10 are formed spaced apart in the other flat-sided surface 102 of the hollow body 10 of the cooling device 1 or the module 1'.

As described in more detail later in FIG. 7, the hollow body 10 is fixed to an even surface 41 of a support 4 in such a way that the other flat-sided surface 102 of the hollow body 10 and the even surface 41 of the support 4 are faced towards each other.

In accordance with the invention, the other flat-sided surface 102 of the hollow body 10 between the fluid openings 11 is concave and elastically deformable and a fixing device 5 for fixing the hollow body 10 to the even surface 41 of the support 4 is provided in such a way that the concave other flat-sided surface 102 of the hollow body 10 and the even surface 41 of the support 4 are pressed against each other by the elastically planar deformation of the concave other flat-sided surface 102 of the hollow body 10.

The other flat-sided surface 102 of the hollow body 10 is predominantly curved in the direction of the longitudinal axis A of the hollow body 10 and can, additionally or alternatively, also be curved in the direction of the III—III or IV—IV perpendicular to longitudinal axis A in FIG. 1, as indicated in FIG. 3b.

The fixing device 5 has, for example two internally-threaded holes 12 in the hollow body 10 between the two coolant fluid openings 11, each of which is sealed against the coolant fluid 3 in the hollow body 10 forming a fluid-proof seal, so that no coolant fluid 3 can flow through this threaded hole 12 out of the hollow body 10 to the outside and each of which has a threaded hole 120 in the concave other flat-sided surface 102 of the hollow body 10, through which an externally-threaded pin 13 passing through the support 4 is screwed into the threaded hole 12 to secure the cooling device 1 or module 1' and support 4 to each other.

Preferably, the threaded holes 12 are arranged on the longitudinal axis A of the hollow body 10 close to a coolant fluid opening 11 in each case.

Each threaded hole 12 is, for example, provided with an internally threaded bush 121 of a material that is harder that the material of the hollow body 10 and is inserted into the hollow body 10.

In the example shown, each threaded hole 12 is a through-hole that passes transversely through the complete hollow body 10 and also has a threaded opening in the one flat-sided surface 101 of the hollow body 10. A threaded hole 12 can also be a blind hole that only has the threaded hole opening 120 in the other flat-sided surface 102 of the hollow body 10 and no opening in the one flat-sided surface 101 of the hollow body 10.

In accordance with the invention, a coolant fluid guide 6 is also formed between the coolant fluid openings 11, that guides the coolant fluid 3 supplied through a coolant fluid opening 11 to the hollow body 10 sideways in the hollow body 10 past the center 110 between the coolant fluid openings 11 of the hollow body 10 to the other coolant fluid opening 11.

The coolant guide 6 is preferably designed so that it is a solid strut 60 of good heat-conducting material that is formed centrally in the hollow body 10 and that joins the two flat-sided surfaces 101 and 102 of the hollow body 10 to each other, that is impermeable with regard to the coolant fluid 3, that extends along a connecting line 111 (see FIG. 2) between the two coolant fluid openings 11 and along both long sides 62 of which the coolant fluid 3, introduced through a coolant fluid opening 11 into the hollow body 10, flows in the hollow body 10 to the other coolant opening 11.

The strut 60 has a front end 61 opposite each coolant fluid opening 11. The front end 61 of the strut 60, that is opposite the coolant fluid opening 11 and adjacent to it, through which the coolant fluid 3 is introduced into the hollow body 10 and, for example, is the left coolant fluid opening 11 shown in FIGS. 2 and 4, defines a deflection surface for deflecting the coolant fluid 3 introduced into the hollow body 10. This deflecting surface is preferably defined by a rounding 610 of this front end 61.

Preferably, the strut 60 shown in FIG. 4 is, relative to the center 110, formed as an essentially symmetrical mirror image between the coolant fluid openings 11 of the hollow body, so that also the other front end 61 of the strut 60, that in the example is positioned opposite the right coolant fluid opening 11 for removing the coolant fluid 3 from the hollow body, has a rounding 610.

Instead of a rounding 610, a different, for example pointed, shape can be chosen.

The front ends 61 of the strut 60 are, for example, arranged at a distance from the coolant fluid openings 11. It can also be designed so that one or each the front end 61 of the strut 60 extends to the edge 112 of a coolant fluid opening 11.

The threaded holes 12 of the hollow body 10 are preferably arranged in the strut 60 and preferably close to the front ends 61 of the strut 60. If the material of this strut 60 is sufficiently hard, the insertion of internally-threaded bushes 121 can be omitted and a threaded hole 12 with an internal thread can be introduced directly in the strut 60. Both measures ensure that the threaded hole 12 is fluid-proof, i.e. no fluid 3 can leak through the threaded hole 12 from the inside of the hollow body 10 to the outside.

In the hollow body 10, a structure 17 of good heat-conducting material, through which the coolant fluid 3 can flow, is formed that offers the flowing coolant fluid 3 an increased contact area and is in good heat-conducting contact with the flat-sided surfaces 101 and 102 of the hollow body 10 and with the strut 60.

The structure 17 of good heating-conducting material is preferably designed in such a way that it has small cavities 171, each of which is enclosed by this material and that are in connection with each other and/or have small channels 172, each of which is enclosed by this material and that connect both coolant fluid openings 11 with each other.

The structure 17 can thus, the same as the corresponding structure from the named U.S. Pat. No. 6,014,312, be produced by a stack of layers, each with a number of small holes, whereby, in contrast to the U.S. patent, with this structure 17 the layers in the area of the strut 60 may not have any holes. The solid strut 60 in this case advantageously itself forms hole-free areas of the layers due to the stacking arrangement.

The structure 17 can also, for example, be formed by filling a cavity of the hollow body 10 surrounding an already present solid strut 60 with lattice material and/or interlinked fabric and/or a sponge of good heat-conducting material, that is in close heat-conducting contact with the flat-sided surfaces 101 and 102 of the hollow body 10 and the solid strut 60.

Also, in contrast to the named U.S. Pat. No. 6,014,312, the structure 17 preferably extends from the good heat-conducting material to the edge 112 of a coolant fluid opening 11. Because the front ends 61 of the strut 60 do not, for example, reach to the edge 112 of the coolant fluid openings, the structure 17 extending to the edge 112 of a coolant fluid opening 11 can even advantageously enclose this edge.

In a case where a front end 61 of the strut 60 extends to the edge 112 of a coolant fluid opening 11, the structure 17 extending to this edge 112 can, of course, not form a surrounding closure at this edge 112, but instead can only extend over a part section of this edge 112.

With the example of an embodiment of the cooling device 1 or of the module 1' shown in FIGS. 1 to 4, the layer 18 of good-heating conducting and electrically-insulating material is placed completely flat on the hollow body 10 and secured to it.

Figure 6:
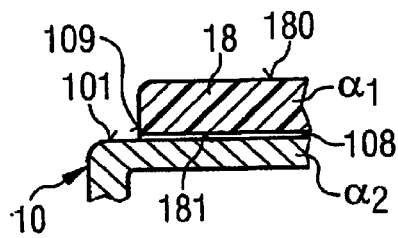
FIG. 6 is an enlarged view of the part of FIG. 3a bounded by the circle B.

For this purpose, for example (see FIG. 6), an electrically-insulating layer 18 coated with a metal layer 108 on the surface 181 (facing away from the surface 180 of the electrically-conducting layer 18 and facing towards the hollow body) of this layer 18 is soldered 109 to the one flat-sided surface 101 of the hollow body 10.

In the present example, the electrically-insulating layer 18 has a relatively smaller thermal coefficient of expansion $\alpha 1$ and the hollow body 10 has a relatively larger thermal coefficient of expansion $\alpha 2$. During soldering, the electrically-insulating layer 18 and the hollow body 10 heat up and expand at different rates, the hollow body 10 more than the layer 18.

As the liquid solder 109 solidifies, the hollow body 10 and layer 18 join together at the still high temperature. During the succeeding cooling, the hollow body 10 contracts more than the layer 18 joined to it, so that after cooling the other flat-sided surface 102 of the hollow body becomes concave on its own and can be elastically deformed.

Because of the stresses existing between the electrically-insulating layer 18 and the hollow body 10 during the later fixing to the support 4, there is a certain tendency for the layer 18 to detach from the hollow body 10. This can be reduced if the layer 18 of good heat-conducting, electrically-insulating material is divided into separate sections 18', as shown in FIG. 18.

With a concrete example of a cooling device 1, already described, that does not limit the protective scope of the invention, that is used for a power semiconductor module 1' as shown in FIG. 1, the hollow body 10 of copper is approximately 100 mm long, approximately 60 mm wide, approximately 3.5 mm thick and consists of a stack of copper layers. The coolant fluid openings 11 arranged on the longitudinal axis A symmetrically to the center 110 are spaced approximately 85 mm apart and each have an opening diameter of approximately 5.5 mm. The threaded holes 12 also arranged on the longitudinal axis A symmetrical to the center 110 are spaced approximately 65 mm apart and each has an opening diameter of approximately 4 mm. The soldered electrically-insulating layer 18, that is not subdivided and essentially extends over the complete rectangular one flat-sided surface 101 of the hollow body 10, consists of $Al_2O_3$ and is approximately 0.4 mm thick. The elastically concave rectangular other flat-sided surface 102 of the hollow body 10 along the longitudinal axis A has a maximum depth of curvature t in the center 110 of approximately 100 μm relative to the front ends 105 of the hollow body 10.

Also vertical to the longitudinal axis A, in the direction of the width of the hollow body 10, i.e. along the line III—III in FIG. 1, is a concave curvature of the other flat-sided surface 102 of the hollow body 10, as shown in FIG. 3b.

With the power semiconductor module 1' shown in FIG. 1, the power semiconductor elements 20 and 20' secured to the electrically-insulating layer 18 of the cooling device, are arranged in succession in plan view onto the surface 180 of this layer 18 next to the strut 60 along both long sides 62 of the strut 60 (see FIG. 4) and are located above the coolant fluid 3 flowing in the hollow body 10 along these two long sides 62.

On each long side 62 of the strut 60 is, for example, a row each including six power semiconductor elements 20, 20', that are arranged in succession in the direction of flow of the coolant fluid 3 (see FIG. 4) flowing along the long sides 62.

Two first power semiconductor elements 20 in each row are, for example, IGBTs, two of the succeeding power semiconductor elements 20' are, for example, diodes and two power semiconductor elements 20 following these diodes 20' are again IGBTs.

The diodes 20' produce a greater amount of heat when operating than the IGBTs 20 and therefore for optimum cooling effect by the cooling device 1 the two diodes 20' in each row are placed between the two pairs of IGBTs 20.

To connect into a known electrical circuit, the IGBTs 20 and diodes 20' are electrically connected in a known manner to busbars 21 arranged on the electrically-insulating layer 18. For example, a single busbar 21 can be arranged above the strut 60, or two or more busbars 21 stacked one above the other and electrically-insulated from each other can be arranged above the strut 60 and/or other busbars 21 can, for example, be arranged between the layer 18 and the power semiconductor elements 20, 20' either individually or also stacked one above the other and electrically insulated from each other on the electrically-insulating layer 18.

The busbars 21 and other electrical conductors can be created by structuring one or more layers of electrically-conducting material on the electrically-insulating layer 18.

For the module 1' shown in FIG. 1, the current collectors for the busbars 21 are designated as 22.

Figure 7:
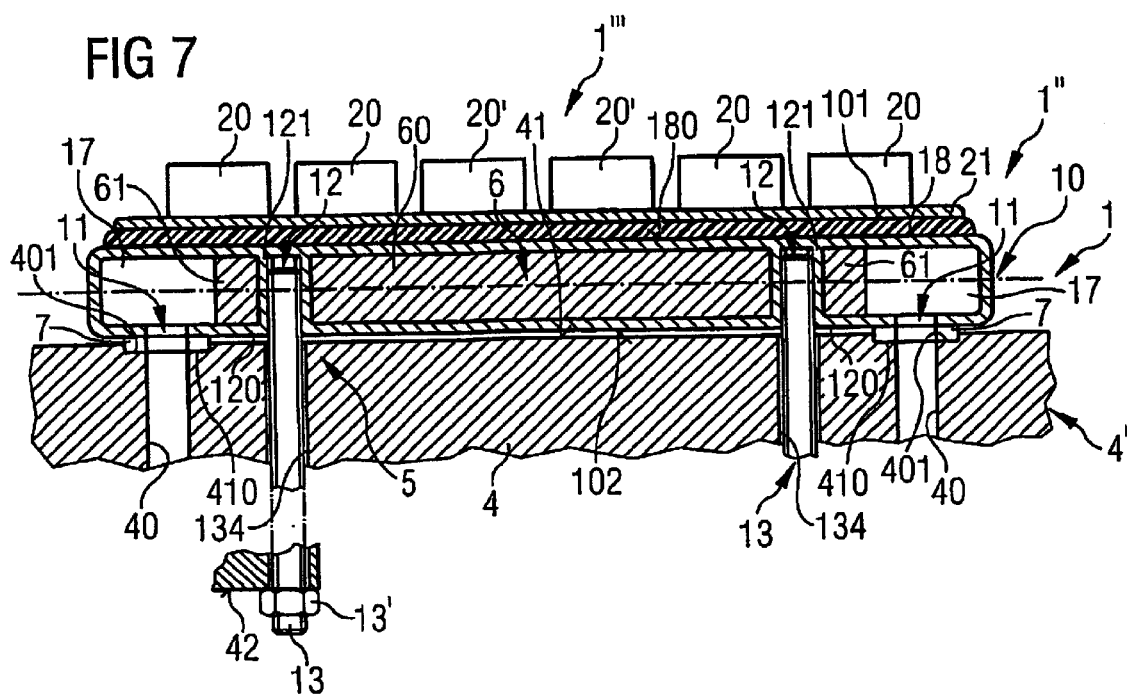
FIG. 7 is a section view according to FIG. 2 showing an arrangement including a module and support that at the same time shows an arrangement including a cooling device and the support, with only part of the support illustrated.

FIG. 7 shows how a cooling device 1 or module 1' with a support 4 can be designed to form an arrangement 1", including the cooling device 1 and the support 4, or to form an arrangement 1''' including the module 1' and the support 4.

The support 4, shown only in part, is designed so that it has an even surface 41 in which, for each coolant fluid opening 11 in the concave other flat-sided surface 102 of the hollow body 10 of the cooling device 1 there is a termination 401 of a coolant fluid channel 40, formed in the support 4, assigned in each case to one of these coolant fluid openings 11, for the supply or removal of coolant fluid 3 to and from the hollow body 10.

The even surface 41 of the support 4 and the concave other flat-sided surface 102 of the hollow body 10 of the cooling device 1, are facing towards each other and arranged so that each coolant fluid opening 11 of the cooling device 1 is opposite the termination 401 of the support 4 assigned to this coolant fluid opening 11.

O-rings 7 of elastic material, each of which encloses a coolant fluid opening 11 of the cooling device 1 and the termination 401 of the fluid channel 40 of the support 4 opposite this coolant fluid opening 11, are arranged between these surfaces 41 and 102 of the support 4 facing towards each other and the cooling device 1.

The cooling device 1 and the support 4 are fixed to each other by the fixing device 5 of the cooling device 1 in such a way that the concave other flat-sided surface 102 of the hollow body 10 of the cooling device 1 is pressed elastically flat in the direction of the arrow P (see FIGS. 2 and 4) pointing to the even surface 41 of the support 4 and each O-ring 7 is compressed between this flat-pressed surface 102 and the even surface 41 of the support 4, so that it seals the coolant fluid opening 11 of the cooling device 1 and the termination 401 of the coolant fluid channel 40 of the support 4 opposite this coolant fluid opening 11, both of which are enclosed by the O-ring 7, fluid-proof against the environment.

Each O-ring 7 is, for example, positioned in a recess 410 in the even surface 41 of support 4 so that it does not slip sideways when assembling arrangement 1" or 1'''. A recess of this kind could either alternatively or additionally also be formed in the other flat-sided surface 102 of the hollow body 10.

Using the fixing device 5 including the two threaded holes 12 in the hollow body 10 and the threaded pins 13, assembly is carried out, for example, so that after arranging the cooling device 1 or module 1' and the support 4 in such a way that the other flat-sided surface 102 of the hollow body 10 and the even surface 41 of the support 4 are facing towards each other and the O-rings 7 are arranged in the correct position between them, so that the threaded pins 13 are inserted through the through holes 134 formed in the support 4, that lie opposite the openings 120 of the threaded holes 12 in the hollow body, and are then screwed into the threaded holes 12, and that then on the side of a surface 42 of the support 4, that is facing away from the even surface 41 of the support 4, a nut 13' is screwed onto each of the threaded pins 13 projecting through the support 4 and then tightened so that the other flat-sided surface 102 of the hollow body 10 is pressed flat, the O-rings are compressed and the hollow body 10 and support 4 are secured to each other. Washers can also be used that are to be placed on the threaded pins 13 between the support 4 and the nuts 13'.

A through-hole 134 formed in the support 4 can also be a threaded hole with an internal thread through which the threaded pins 13 can be screwed to screw into a threaded hole 12 in the hollow body 10.

FIG. 7 actually shows an arrangement 1''' including a module 1' and support 4. The arrangement 1'' including cooling device 1 and support 4 results if the illustrated electrical components 20, 20' and 21 are ignored.

The support 4 is preferably a part of an electrical transmission system 4', particularly an electrical transmission system 4' for a vehicle for cooling the power semiconductor elements required for the electrical supply of the part.

The cooling device 1 and the module 1' are characterized by their extremely flat construction, and particular suitability for installation in confined spaces.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A cooling device for cooling at least one electrical component and for attachment to a support having an even surface, said cooling device comprising:
    a hollow body including suitable heat-conducting and electrically-insulating material formed in a substantially flat plate shape, conducting a coolant fluid between first and second flat-sided surfaces opposing each other,
        the first flat-sided surface receiving each component to be cooled, and
        the second flat-sided surface having at least two coolant fluid openings, spaced apart, supplying and removing the coolant fluid to and from said hollow body, and to be attached to the even surface of the support, where the second flat-sided surface of said hollow body between the coolant fluid openings is concave and elastically deformable; and
    an attachment device attaching said hollow body to the even surface of the support and pressing together the concave portion of the second flat-sided surface of said hollow body and the even surface of the support with an elastic, planar deformation of the concave portion of the second flat-sided surface of said hollow body.

2. A cooling device in accordance with claim 1
    wherein said hollow body further includes at least two threaded holes formed in the concave portion of the second flat-sided surface of said hollow body between the at least two coolant fluid openings, each of the threaded holes being sealed fluid-tight against the coolant fluid in said hollow body so that the coolant fluid cannot leak from said hollow body through the threaded holes, and
    wherein said attachment device includes at least two threaded pins, each projecting through the support into a corresponding one of the threaded holes, to secure said cooling device to the support.

3. A cooling device in accordance with claim 1, wherein the at least two coolant fluid openings are first and second coolant fluid openings on either side of a center of said hollow body, and said hollow body further includes a coolant fluid guide between the first and second coolant fluid openings to guide the coolant fluid, introduced through the first coolant fluid opening into said hollow body, sideways past the center of said hollow body to the second coolant fluid opening.

4. A cooling device in accordance with claim 3 wherein the coolant fluid guide is a solid strut of suitable heat-conducting material, formed centrally in said hollow body that connects the first and second flat-sided surfaces of said hollow body to each other, impermeable to the coolant fluid and extending between the first and second coolant fluid openings and along which the coolant fluid introduced into said hollow body through the first coolant fluid opening flows in said hollow body to the second coolant fluid opening.

5. A cooling device in accordance with claim 4 wherein the strut has a rounded front end opposite the first coolant fluid opening.

6. A cooling device in accordance with claim 5 wherein one of the threaded holes in said hollow body is formed in the strut.

7. A cooling device in accordance with claim 6, further comprising a structure of suitable heat-conducting material, formed in said hollow body in heat-conducting contact with the first and second flat-sided surfaces of said hollow body, through which the coolant fluid can flow in contact with many surfaces of said structure.

8. A cooling device in accordance with claim 7 wherein said structure includes small cavities in contact with the coolant fluid flowing through said structure.

9. A cooling device in accordance with claim 8 wherein said structure includes multiple channels connecting the at least two coolant fluid openings.

10. A cooling device in accordance with claim 9 wherein said structure material extends to edges of at least one of the coolant fluid openings.

11. A cooling device in accordance with claim 10
    wherein said hollow body further includes electrically-conducting material, and
    wherein each of the at least one electrical component attached to said cooling device is electrically insulated by a layer of the suitable heat-conducting and electrically-insulating material from the coolant fluid in said hollow body, connected in parallel and attached to the first flat-side surface of said hollow body.

12. A cooling device in accordance with claim 11 wherein the layer of suitable heat-conducting and electrically-insulating material is divided into sections separated from each other.

13. A cooling device in accordance with claim 12 wherein the layer of suitable heat-conducting and electrically-insulating material is of ceramic material.

14. A cooling device in accordance with claim 13 wherein the electrically-conducting material of said hollow body includes copper.

15. A cooling device in accordance with claim 14 wherein the layer of suitable heat-conducting and electrically-insulating material has a smaller thermal coefficient of expansion than other material forming said hollow body.

16. A cooling device in accordance with claim 15 wherein the at least one electrical component includes power semiconductor elements.

17. A module for attachment to a support having an even surface, comprising:
- a cooling device, including:
  - a hollow body including suitable heat-conducting and electrically-insulating material formed in a substantially flat plate shape, conducting a coolant fluid between first and second flat-sided surfaces opposing each other, the first flat-sided surface receiving each component to be cooled, and the second flat-sided surface having at least two coolant fluid openings, spaced apart, supplying and removing the coolant fluid to and from said hollow body, where the second flat-sided surface of said hollow body between the coolant fluid openings is concave and elastically deformable; and
  - an attachment device attaching said hollow body to the even surface of the support and pressing together the concave portion of the second flat-sided surface of said hollow body and the even surface of the support with an elastic, planar deformation of the concave portion of the second flat-sided surface of said hollow body; and
- at least one electrical component attached to the first flat-sided surface of said hollow body of the cooling device.

18. A module in accordance with claim 17
wherein the at least two coolant fluid openings are first and second coolant fluid openings on either side of a center of said hollow body,
wherein said hollow body further includes a coolant fluid guide between the first and second coolant fluid openings to guide the coolant fluid, introduced through the first coolant fluid opening into said hollow body, sideways past the center of said hollow body to the second coolant fluid opening, and
wherein each of said at least one electrical component is arranged on the first flat-sided surface of said hollow body in an area adjacent to where the coolant fluid flows in the coolant fluid guide past the center between the coolant fluid openings of said hollow body.

19. A module in accordance with claim 18 wherein said at least one electrical component includes a plurality of electrical components that generate different amounts of heat in operation and are arranged along a direction of flow of the coolant fluid in increasing generation of heat.

20. A module in accordance with claim 19 wherein said at least one electrical component includes a power semiconductor element.

21. An arrangement in accordance with claim 20 further comprising at least one electrical component attached to the first flat-sided surface of said hollow body of the cooling device.

22. An arrangement in accordance with claim 21 wherein the support is part of an electrical transmission system.

23. An arrangement in accordance with claim 22 wherein the support is part of an electrical transmission system for a vehicle.

24. An arrangement for cooling at least one electrical component, comprising
- a support having an even surface and at least two coolant channels each with a termination at the even surface;
- a cooling device, including:
  - a hollow body including suitable heat-conducting and electrically-insulating material formed in a substantially flat plate shape, conducting a coolant fluid between first and second flat-sided surfaces opposing each other, the first flat-sided surface receiving each component to be cooled, and the second flat-sided surface having at least two coolant fluid openings, spaced apart and each aligned with a corresponding termination of the at least two coolant channels of said support to supply and remove the coolant fluid to and from said hollow body, where the second flat-sided surface of said hollow body between the coolant fluid openings is concave and elastically deformable; and
  - an attachment device attaching said hollow body to the even surface of the support and pressing together the concave portion of the second flat-sided surface of said hollow body and the even surface of said support with an elastic, planar deformation of the concave portion of the second flat-sided surface of said hollow body; and
- O-rings of elastic material, arranged between the second flat-sided surface of said hollow body and the even surface of said support, each enclosing one of the at least two coolant fluid openings of said cooling device and the corresponding termination of the at least two fluid channels of said support, where said attachment device compresses the O-rings between the even surface of said support and the planar deformation of the concave portion of the second flat-sided surface of said hollow body to seal the at least two coolant fluid openings of said cooling device and each corresponding termination of the coolant fluid channel of said support by forming a fluid-proof seal.

* * * * *